(12) United States Patent
Sundaram et al.

(10) Patent No.: US 8,489,780 B2
(45) Date of Patent: Jul. 16, 2013

(54) POWER SAVING IN NAND FLASH MEMORY

(75) Inventors: Rajesh Sundaram, Folsom, CA (US); Rodney R. Rozman, Placerville, CA (US); Sanjay S. Talreja, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 836 days.

(21) Appl. No.: 11/644,474

(22) Filed: Dec. 21, 2006

(65) Prior Publication Data

US 2008/0155287 A1    Jun. 26, 2008

(51) Int. Cl.
*G06F 3/00* (2006.01)
*G06F 1/32* (2006.01)

(52) U.S. Cl.
USPC .......................................... 710/14; 713/323

(58) Field of Classification Search
USPC ........................................................... 710/14
See application file for complete search history.

(56) References Cited

U.S. PATENT DOCUMENTS

| | | | | |
|---|---|---|---|---|
| 5,818,350 A | * | 10/1998 | Estakhri et al. | 340/825.52 |
| 6,243,821 B1 | * | 6/2001 | Reneris | 713/323 |
| 6,400,633 B1 | * | 6/2002 | Al-Shamma et al. | 365/189.15 |
| 6,510,488 B2 | * | 1/2003 | Lasser | 711/103 |
| 6,523,089 B2 | * | 2/2003 | Tsern et al. | 711/118 |
| 6,618,791 B1 | * | 9/2003 | Dodd et al. | 711/105 |
| 2002/0120820 A1 | * | 8/2002 | Higuchi et al. | 711/154 |
| 2006/0129701 A1 | | 6/2006 | Qawami et al. | |

* cited by examiner

*Primary Examiner* — Henry Tsai
*Assistant Examiner* — Titus Wong
(74) *Attorney, Agent, or Firm* — Blakely, Sokoloff, Taylor & Zafman LLP

(57) ABSTRACT

Some embodiments of the invention may use a single control line signal as both a wake up signal and as an indicator of a device selection command. In a command-based protocol on a non-volatile memory bus, a host memory controller may assert a signal on a control line to bring all the memory devices on the bus into an operational mode, while concurrently placing a device selection command on the input/output lines. The memory device selected by the selection command may remain operational to perform a sequence of operations as directed by the host controller. The remaining (non-selected) memory devices may return to a sleep mode until a new signal on the control line is received, indicating a new selection command.

14 Claims, 3 Drawing Sheets

POWER SAVING IN NAND FLASH MEMORY

BACKGROUND

When a command-based architecture is used with non-volatile memory devices, one or more commands may be sent to multiple memory devices on a common bus. The commands may indicate which of the multiple memory devices is to perform a memory operation, and also what memory operation the selected device is to perform. Other information, such as address and data for the selected memory device, may then follow on the same bus lines. Once the command has selected a particular memory device, the other memory devices can ignore the remaining address and data information, but must still remain powered up so they can monitor the bus for the next command. This need to stay powered up can result in consuming a lot of power by individual memory devices that are inactive most of the time.

BRIEF DESCRIPTION OF THE DRAWINGS

Some embodiments of the invention may be understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure an understanding of this description.

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

As used in the claims, unless otherwise specified the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

Some embodiments of the invention may use a single signal line as both a wake up indicator and as a selection command indicator. In a command-based protocol on a non-volatile memory bus, a host memory controller may issue a wake up signal concurrently with a command to select a particular memory device for an operation. The subsequent memory bus cycles may then be used for identifying the particular type of operation, providing address information, and/or transferring data to/from the selected memory device. The non-selected memory devices may go into a sleep mode after the selection command and only wake up when a new wake up signal is issued.

Figure 1:
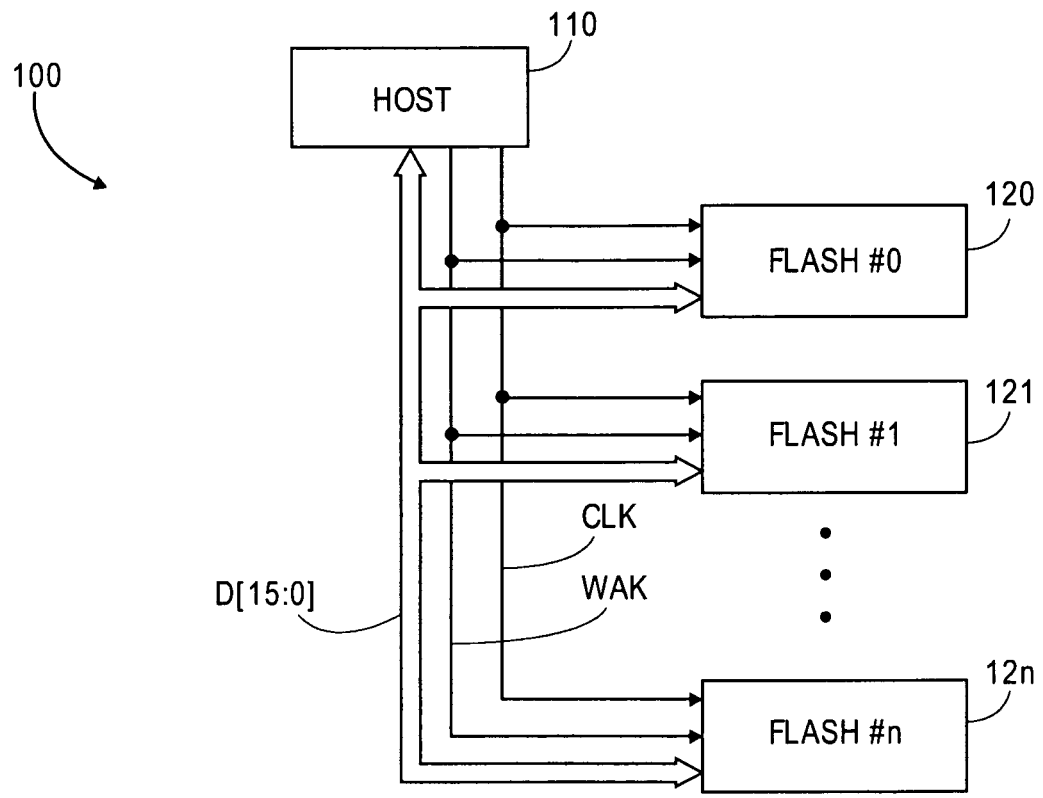
FIG. 1 shows a diagram of a system containing non-volatile memory devices controlled by a host controller, according to an embodiment of the invention.

FIG. 1 shows a diagram of a system containing non-volatile memory devices controlled by a host controller, according to an embodiment of the invention. Although the drawing is labeled for flash devices, in some embodiments the memory devices 120-12$n$ may be based on other types of non-volatile memory technology. In some embodiments, the memory devices are NAND flash memory devices. In some embodiments, each memory device 120-12$n$ is contained in a separate integrated circuit, but other embodiments may combine multiple individually selectable memory devices into a single integrated circuit and/or a single package, with each memory device having its own separately controllable low power mode. Each indicated signal line may connect to the indicated memory device through a pin.

Each memory device 120-12$n$ may be controlled by a host controller 110, which in the illustrated embodiment controls the memory devices through a common bus containing a set of input/output (I/O) lines D[15:0], a clock line CLK, and a control line WAK that connects in parallel to all the memory devices on the bus. Although specific labels are used here to describe the various lines and their functions, these are for convenience only and other embodiments may use any convenient set of labels. Sixteen I/O lines are indicated by D[15:0] in the drawing, but other embodiments may contain other quantities of I/O lines (e.g., 4, 8, 32, 64, etc.). In some embodiments, the bus may contain no other signal lines than the ones shown. Power lines to provide operating power to the memory devices are not shown, and may take any feasible form. During operation, the host controller may select, and communicate with, any of the memory devices 120-12$n$ over the bus, by placing a command on the I/O lines and asserting a signal on the WAK line. In some embodiments, the host controller may reside in a separate integrated circuit from the memory devices.

In the illustrated embodiment, the host controller 110 may transfer data to or from one of the memory devices by first sending a selection command over the I/O lines that indicates which of the memory devices is being selected for an operation. Concurrently with this command, the WAK line may be asserted to cause the memory devices on the bus to wake up and sense the I/O lines. The particular memory device that sees its own identification number on those I/O lines may then stay active to continue communications with the host controller, while the remaining memory devices may return to a sleep mode. In subsequent clock cycles on the bus, the selected memory device may receive further information on the I/O lines about the intended operation, and may also transfer data over those I/O lines. For example, the clock cycle following the selection command may contain an indicator of what type of operation the selected device is to perform. Clock cycles may also contain an address at which a data transfer operation is to start in the memory array of the selected memory device.

In some embodiments, the host controller may also initiate operations that do not involve memory addresses. For instance, the host controller may issue a command that the selected memory device is to return some type of status information to the host controller. In such a case, no memory address need be sent, and the selected memory device might follow the operations command by placing its requested status on the I/O lines for reading by the host controller. Similarly, the host controller might issue a command that configuration data is to be written into the memory device, in which case the host controller might follow the command by placing the configuration data on the I/O lines, for reading and implementation by the selected memory device.

Figure 2:
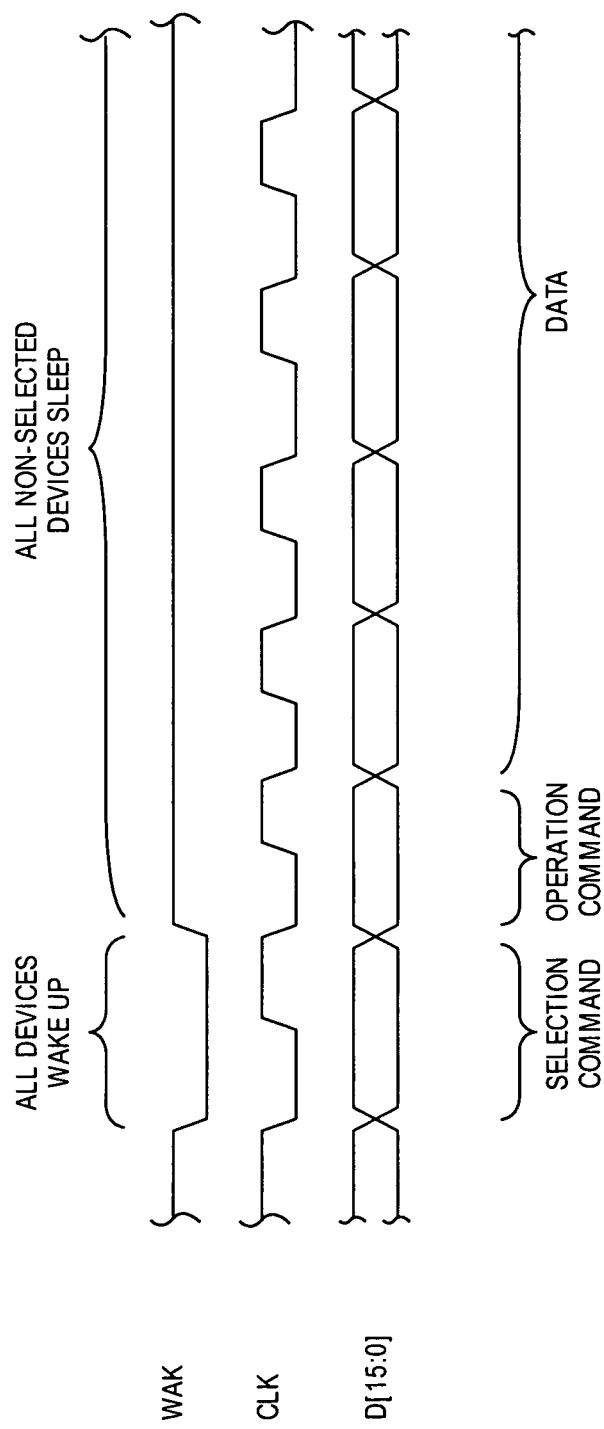
FIG. 2 shows a timing diagram of a communications sequence between a host controller and a non-volatile memory device, according to an embodiment of the invention.

FIG. 2 shows a timing diagram of a communications sequence between a host controller and a non-volatile memory device, according to an embodiment of the invention. In the illustrated embodiment, each clock cycle may be used to latch the signals on the I/O lines. In the embodiment shown, a clock transition in one direction (in this case low-to-high) may latch the data, while a clock transition in the opposite direction may coincide approximately with the signal level changes on the I/O lines. Other embodiments may use other clock timing schemes (for example, a double data rate embodiment might use clock transitions in both directions to latch data, while the signals on the I/O lines would change between clock transitions). Any polarity may be used for any of the signal lines, depending on the convention chosen for the bus design.

In the embodiment shown, a WAK signal is asserted (in the example, low is asserted, high is deasserted) to cause the memory devices on the memory bus to wake up and sense the I/O lines. The data on the I/O lines during that time may be latched in the memory device by the CLK signal and used to determine which memory device is being selected for an operation. All non-selected memory devices may return to the sleep mode after the WAK signal is deasserted, while the selected memory device may remain active to continue with the communications sequence. The illustrated embodiment implements the wakeup and selection operation in a single clock cycle, implying for this example that all versions of a selection command may be contained within the 16 available I/O lines, and that the non-selected devices don't need to perform other operations before going back into a sleep mode. Other embodiments may use other conventions. In the clock cycle following the wakeup command, an operation command may be placed on the I/O lines by the host controller to define what type of operation is to be performed by the selected memory device. Some examples might be read data, write data, read status, write configuration, etc. In some embodiments the number of clock cycles in the selection command and/or the operation command may be fixed, but in other embodiments the first part of the command itself may contain an indication of how many clock cycles are to be used to transfer the entire command.

In some embodiments if the command indicates a data transfer is to be conducted involving the selected device's memory array, the operation command may contain a starting address for that data transfer. In other embodiments, the subsequent clock cycles may be used for that information. All subsequent clock cycles after the operation command have been labeled DATA in the drawing. The exact nature of that data may vary, depending on the operation. Some embodiments may use a separate signal (not shown) that will wake up the memory devices even though a selection command is not in progress. For example, a reset signal might cause all the memory devices to wake up and place themselves in a known initial configuration Note: as used in this document, a 'sleep mode' may represent any low power mode that the memory device can be placed in that makes the memory device non-operational and reduces its power consumption but does not cause loss of stored data in the memory device. This may encompass low power modes that may be described by others with other terms.

In some embodiments the length of the sequence (or of some portion of the sequence, such as the data portion) may be fixed. In other embodiments, the length may be variable, and a portion of the selection and/or operation command may specify that length.

Figure 3:
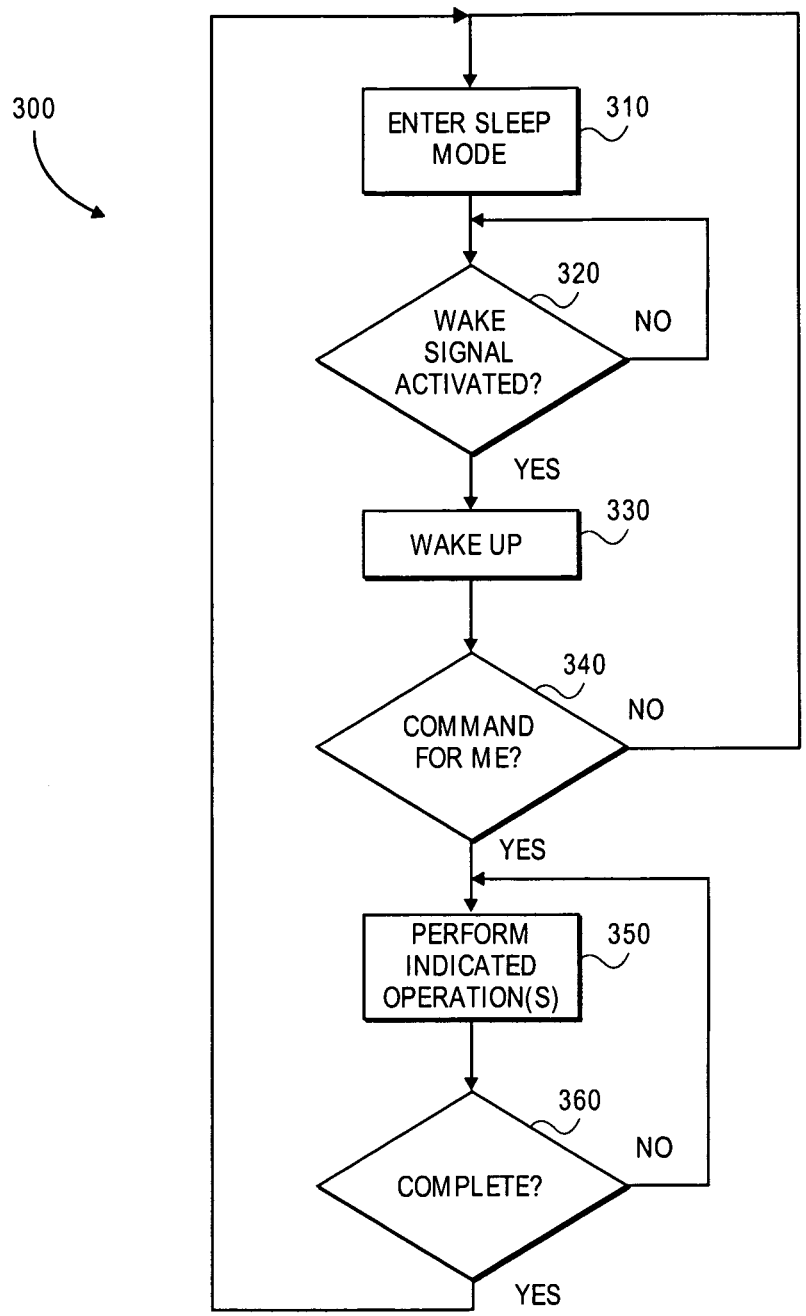
FIG. 3 shows a flow diagram of a method of performing operations in a memory device, according to an embodiment of the invention.

FIG. 3 shows a flow diagram of a method of performing operations in a memory device, according to an embodiment of the invention. In flow diagram 300, at 310 the memory device may enter a sleep mode, in which it is unable to interpret signals on the I/O lines. It may remain in the sleep mode until an asserted signal on the WAK line at 320 causes it to wake up at 330 and decode the signals on the I/O lines as a selection command. If the command indicates that another device is being selected, as indicated at 340, the current memory device may return to a sleep mode at 310. But if the identification portion of the command matches the identification of the memory device performing these operations, as indicated at 340, then the device may remain awake and continue to process the remaining portions (for example, the address and/or data portions) of the communications sequence at 350. When the operations are complete at 360, the memory device can return to sleep mode at 310 until the WAK signal is asserted again.

By following the techniques described here, a non-volatile memory system may keep all the memory devices on the bus in a sleep mode until a device selection command is issued, and return all but the selected memory device to a sleep mode while the indicated operation is being performed with the selected memory device. Alternately, any memory device that is already awake and performing an operation when the selection command is received may remain awake and continue performing its task even though it was not selected by the selection command. Thus, multiple memory devices may each perform individual operations at the same time without departing from the protocol, allowing operations with long execution times (e.g., array read, array write, erase) to be performed in an efficient, time-overlapping manner across multiple devices.

The foregoing description is intended to be illustrative and not limiting. Variations will occur to those of skill in the art. Those variations are intended to be included in the various embodiments of the invention, which are limited only by the spirit and scope of the following claims.

What is claimed is:

1. A non-volatile memory device, comprising:
a plurality of input/output (I/O) signal pins for coupling to a bus and to receive a communications sequence comprising I/O signals from a bus;
a control signal pin for coupling to the bus and to receive a control signal from the bus; and
circuitry to:
transition the non-volatile memory device from a non-operational sleep mode to an operational mode upon assertion of the control signal, the non-volatile memory device to further include a powered-off mode;
determine whether the communications sequence identifies the non-volatile memory device;
in response to determining the communications sequence does not identify the first non-volatile memory device, return the non-volatile memory device to the non-operational sleep mode upon deassertion of the signal on the control pin; and in response to determining the communications sequence does identify the first non-volatile memory device, remain in the operational mode and perform an operation indicated by the communications sequence.

2. The non-volatile memory device of claim 1, wherein the non-volatile memory device comprises a flash memory device.

3. The non-volatile memory device of claim 2, wherein the flash memory device comprises a NAND flash memory device.

4. The non-volatile memory device of claim 1, further comprising a clock signal pin to receive a clock signal to latch the communications sequence on the I/O pins.

5. A method, comprising:

receiving an asserted control signal and a control sequence on a control signal and a plurality of input/output (I/O) signal pins included on a non-volatile memory device from a host controller via a bus communicatively coupling the non-volatile memory device and the host controller;

changing an operational mode of the non-volatile memory device from a non-operational sleep mode to an operational mode in response to receiving the control signal, the memory device further having a powered-off mode;

in response to changing the non-volatile memory device to the operational mode, determining whether the communications sequence identifies the non-volatile memory device during the control signal;

in response to determining the communications sequence does not identify the non-volatile memory device, returning the non-volatile memory device to the non-operational sleep mode upon deassertion of the control signal; and in response to determining the communication sequence does identify the non-volatile memory device, remaining in the operational mode after deassertion of the control signal and performing an operation indicated by the communications sequence.

6. The method of claim 5, further comprising returning to the non-operational low power mode subsequent to performing the operation indicated by the control sequence.

7. The method of claim 5, wherein the operation indicated by the communications sequence comprises either a read data operation or a write data operation.

8. A system comprising:

a first and a second non-volatile memory device, each device having a set of input/output (I/O) signal pins, a control signal pin, and a plurality device states comprising a powered-off mode, a non-operational sleep mode and an operational mode, the first non-volatile memory device separately selectable from the second non-volatile memory device;

a host controller coupled to the first and the second non-volatile memory devices through a bus connected to the I/O signal pins and the control signal pins of the devices, the host controller to assert a signal on the control signal pin to cause the first and second non-volatile memory devices to transition from the sleep mode to the operational mode, and to assert signals on the I/O pins comprising a communications sequence identifying the first non-volatile memory device;

wherein the first non-volatile memory device is to determine that the communications sequence from the host controller identifies the first non-volatile memory device and to remain in the operational mode after deassertion of the signal on the control signal pin to perform an operation further identified by the communications sequence; and wherein the second non-volatile memory device is to determine that the communications sequence from the host controller does not identify the second non-volatile memory device and to return to the sleep mode after deassertion of the signal on the control signal pin.

9. The system of claim 8, wherein the host controller is contained in a different integrated circuit than the first and second non-volatile memory devices.

10. The system of claim 8, wherein the first and second non-volatile memory devices further comprise a clock pin to receive a clock signal to clock the signals on the I/O pins.

11. The system of claim 8, wherein the first and the second non-volatile memory devices are included in separate integrated circuits.

12. The system of claim 8, wherein the first and the second non-volatile memory devices are included in the same integrated circuit.

13. The method of claim 5, wherein the non-volatile memory device comprises a flash memory device.

14. The method of claim 13, wherein the flash memory device comprises a NAND flash memory device.

* * * * *